United States Patent
Okada

(10) Patent No.: US 7,760,325 B2
(45) Date of Patent: Jul. 20, 2010

(54) EXPOSURE SYSTEM AND METHOD FOR MANUFACTURING DEVICE

(75) Inventor: Yoshiyuki Okada, Sakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 208 days.

(21) Appl. No.: 12/118,254

(22) Filed: May 9, 2008

(65) Prior Publication Data
US 2009/0011376 A1    Jan. 8, 2009

(30) Foreign Application Priority Data
May 31, 2007    (JP) .............................. 2007-146347

(51) Int. Cl.
G03B 27/52 (2006.01)
G03B 27/42 (2006.01)
(52) U.S. Cl. .......................................... 355/30; 355/53
(58) Field of Classification Search .................. 355/30, 355/53, 67; 250/548; 356/399–401
See application file for complete search history.

(56) References Cited

U.S. PATENT DOCUMENTS

| | | | |
|---|---|---|---|
| 4,786,947 A * | 11/1988 | Kosugi et al. .................. 355/30 |
| 6,700,641 B2 | 3/2004 | Shiraishi | |
| 6,762,820 B2 * | 7/2004 | Udagawa et al. ............... 355/30 |
| 6,987,554 B2 * | 1/2006 | Nomoto ........................ 355/53 |
| 7,283,199 B2 * | 10/2007 | Aichi et al. .................... 355/30 |
| 2005/0110968 A1 | 5/2005 | Aichi et al. | |

FOREIGN PATENT DOCUMENTS

| JP | 11-135429 A | 5/1999 |
|---|---|---|
| JP | 2002-157170 A | 5/2002 |
| JP | 2005-142382 A | 6/2005 |

* cited by examiner

*Primary Examiner*—Hung Henry Nguyen
(74) *Attorney, Agent, or Firm*—Canon U.S.A., Inc. I.P. Division

(57) ABSTRACT

An exposure system includes an exposure apparatus and a fluid supplying apparatus that supplies fluid to the exposure apparatus via flow channels. The fluid supplying apparatus includes a fluid sending unit, a heat exchanger, a first temperature sensor that measures the temperature of the fluid, a filter that removes unwanted substances in the fluid, and a heater disposed downstream of the filter in the fluid supplying apparatus for adjusting the temperature of the fluid. The exposure apparatus includes a second temperature sensor that measures the temperature of the fluid supplied from the fluid supplying apparatus. The heater adjusts the temperature of the fluid on the basis of the information on the temperature measured by the second temperature sensor.

29 Claims, 9 Drawing Sheets

EXPOSURE SYSTEM AND METHOD FOR MANUFACTURING DEVICE

BACKGROUND OF THE INVENTION

1. Field of the Invention

The present invention relates to exposure systems including exposure apparatuses that expose substrates to light and fluid supplying apparatuses that supply fluid to the exposure apparatuses via flow channels, and relates to methods for manufacturing devices.

2. Description of the Related Art

Recently, higher productivity has been required for semiconductor integrated circuits such as ICs and LSI circuits. With this, power consumption of semiconductor exposure apparatuses has been increasing. On the other hand, circuit patterns have been increasingly miniaturized, and it has been necessary to maintain the environments inside the exposure apparatuses in a more stable state. In order to recover heat generated in an exposure apparatus and to reduce influences of, for example, temperature changes in a clean room in which the exposure apparatus is installed, a gaseous or liquid cooling medium serving as a fluid whose temperature is precisely controlled is supplied to the exposure apparatus. The air in the clean room contains chemical pollutants such as basic gases including ammonia and amine; acid gases including sulfuric acid, nitric acid, and hydrogen chloride; and organic gases including siloxane in trace amounts. When the air containing these chemical pollutants enters the exposure apparatus, the chemical pollutants can photochemically react with the exposure light source such as excimer laser beams that are short-wavelength ultraviolet rays, and can adhere to the surfaces of optical parts in the exposure apparatus, resulting in fogging of the parts. The adhesion of the fogging substances can cause a reduction or unevenness in the illuminance of the exposure light, and can preclude the exposure performance from being kept at a predetermined level.

Since it is necessary to reduce the concentration of the chemical pollutants contained in the air to one ppb or less, a chemical filter is used. The chemical filter removes the basic gases and the acid gases by using an ion-exchange reaction, and removes the organic gases by physically adhering the gases using activated carbon. The chemical filter can have various shapes. For example, a plurality of quadrangular chemical filters, each of whose sides is 600 mm and whose thickness is 60 mm, can be stacked in accordance with the target concentration of the chemical pollutants required for the installation environment. Since the chemical filter has a very high heat capacity, the thermal time constant thereof becomes extremely long, for example, from several minutes to several tens of minutes. Thus, although the concentration of the chemical pollutants in the air passing through the chemical filter can be reduced, there is a long time lag between the temperature at the entrance of the chemical filter and that at the exit of the chemical filter. Moreover, since the chemical filter absorbs or vaporizes moisture in the air when the humidity in the air before and behind the chemical filter is changed, the temperature of the air downstream of the chemical filter is changed by the heat absorption or the heat vaporization although the chemical filter has an effect on the removal of the chemical pollutants. Japanese Patent Laid-Open No. 2002-158170, for example, describes a technology for reducing the influences of temperature changes caused by changes in humidity in the vicinity of a chemical filter. Moreover, Japanese Patent Laid-Open No. 11-135429, for example, describes a technology in which an exposure apparatus and a fluid supplying apparatus are separated from each other.

The technology described in Japanese Patent Laid-Open No. 2002-158170 includes a temperature sensor disposed downstream of the chemical filter, and controls a heater disposed upstream of the chemical filter. Therefore, the response of the temperature control system is significantly limited by the long thermal time constant of the chemical filter. Furthermore, a temperature disturbance caused by the chemical filter, environmental changes superimposed downstream of the chemical filter, and a disturbance caused by, for example, changes in load in the exposure apparatus cannot be sufficiently reduced. In addition, the temperature sensor disposed downstream of the chemical filter controls the heater, and a temperature sensor for measuring the temperature of a cooler disposed upstream of the heater controls the cooler in this technology. Since the temperature control of the heater and that of the cooler are independent, the temperature cannot be precisely controlled when the temperature disturbance caused by the chemical filter and the temperature disturbance superimposed downstream of the chemical filter become so large as to exceed the heating capacity of the heater. As a result, the temperature stability of fluid supplied to the exposure apparatus cannot be maintained at a required level. Moreover, since the chemical filter is very large, the footprint of the exposure apparatus is increased, resulting in an increase in space occupied by the exposure apparatus in the clean room.

The technology described in Japanese Patent Laid-Open No. 11-135429 includes a temperature adjusting unit and a temperature sensor disposed downstream of the temperature adjusting unit in an exposure apparatus, and a temperature control unit controls the temperature of fluid supplied to the exposure apparatus. Furthermore, the value of the temperature sensor is fed back to a fluid supplying apparatus separated from the exposure apparatus such that the temperature of the fluid supplied to the exposure apparatus is controlled by operating a heater disposed in the fluid supplying apparatus. However, since the two temperature adjusting units are provided for the one temperature sensor, interference occurs in the control, preventing a precise temperature control.

SUMMARY OF THE INVENTION

The present invention is directed to an exposure apparatus with improved temperature stability.

According to a first aspect of the present invention, an exposure system includes an exposure apparatus configured to expose a substrate and a fluid supplying apparatus configured to supply fluid to the exposure apparatus via a flow channel. The fluid supplying apparatus includes a fluid sending unit configured to circulate the fluid via the exposure apparatus; a first temperature adjusting unit configured to adjust the temperature of the fluid; a removing unit disposed downstream of the first temperature adjusting unit in the fluid supplying apparatus and configured to remove unwanted substances in the fluid; a first temperature measuring unit disposed between the first temperature adjusting unit and the removing unit and configured to measure the temperature of the fluid, the information on the measured temperature being used for controlling the first temperature adjusting unit; and a second temperature adjusting unit disposed downstream of the removing unit in the fluid supplying apparatus and configured to adjust the temperature of the fluid. The exposure apparatus includes a second temperature measuring unit configured to measure the temperature of the fluid supplied from the fluid supplying apparatus. The second temperature adjusting unit adjusts the temperature of the fluid on the basis of the information on the temperature measured by the second temperature measuring unit.

According to a second aspect of the present invention, an exposure system includes an exposure apparatus configured to expose a substrate and a fluid supplying apparatus configured to supply fluid to the exposure apparatus via a flow channel. The fluid supplying apparatus includes a fluid sending unit configured to circulate the fluid via the exposure apparatus; a first temperature adjusting unit configured to adjust the temperature of the fluid; and a first temperature measuring unit disposed downstream of the first temperature adjusting unit in the fluid supplying apparatus and configured to measure the temperature of the fluid, the information on the measured temperature being used for controlling the first temperature adjusting unit. The exposure apparatus includes a second temperature measuring unit configured to measure the temperature of the fluid supplied from the fluid supplying apparatus. The first temperature adjusting unit adjusts the temperature of the fluid on the basis of the information on the temperature measured by the first temperature measuring unit and the information on the temperature measured by the second temperature measuring unit.

According to a third aspect of the present invention, an exposure system includes an exposure apparatus configured to expose a substrate and a fluid supplying apparatus configured to supply fluid to the exposure apparatus via a flow channel. The fluid supplying apparatus includes a fluid sending unit configured to circulate the fluid via the exposure apparatus; a first temperature adjusting unit configured to adjust the temperature of the fluid; and a first temperature measuring unit disposed downstream of the first temperature adjusting unit in the fluid supplying apparatus and configured to measure the temperature of the fluid, the information on the measured temperature being used for controlling the first temperature adjusting unit. The exposure apparatus includes a second temperature measuring unit configured to measure the temperature of the fluid supplied from the fluid supplying apparatus; a second temperature adjusting unit disposed downstream of the second temperature measuring unit in the exposure apparatus and configured to adjust the temperature of the fluid; and a third temperature measuring unit disposed downstream of the second temperature adjusting unit in the exposure apparatus and configured to measure the temperature of the fluid, the information on the measured temperature being used for controlling the second temperature adjusting unit. The first temperature adjusting unit adjusts the temperature of the fluid on the basis of the information on the temperature measured by the first temperature measuring unit and the information on the temperature measured by the second temperature measuring unit. The second temperature adjusting unit adjusts the temperature of the fluid on the basis of the information on the temperature measured by the third temperature measuring unit.

Further features and aspects of the present invention will become apparent from the following description of exemplary embodiments with reference to the attached drawings.

DESCRIPTION OF THE EMBODIMENTS

Exemplary embodiments, features and aspects of the present invention will now be described with reference to the drawings.

Figure 7:
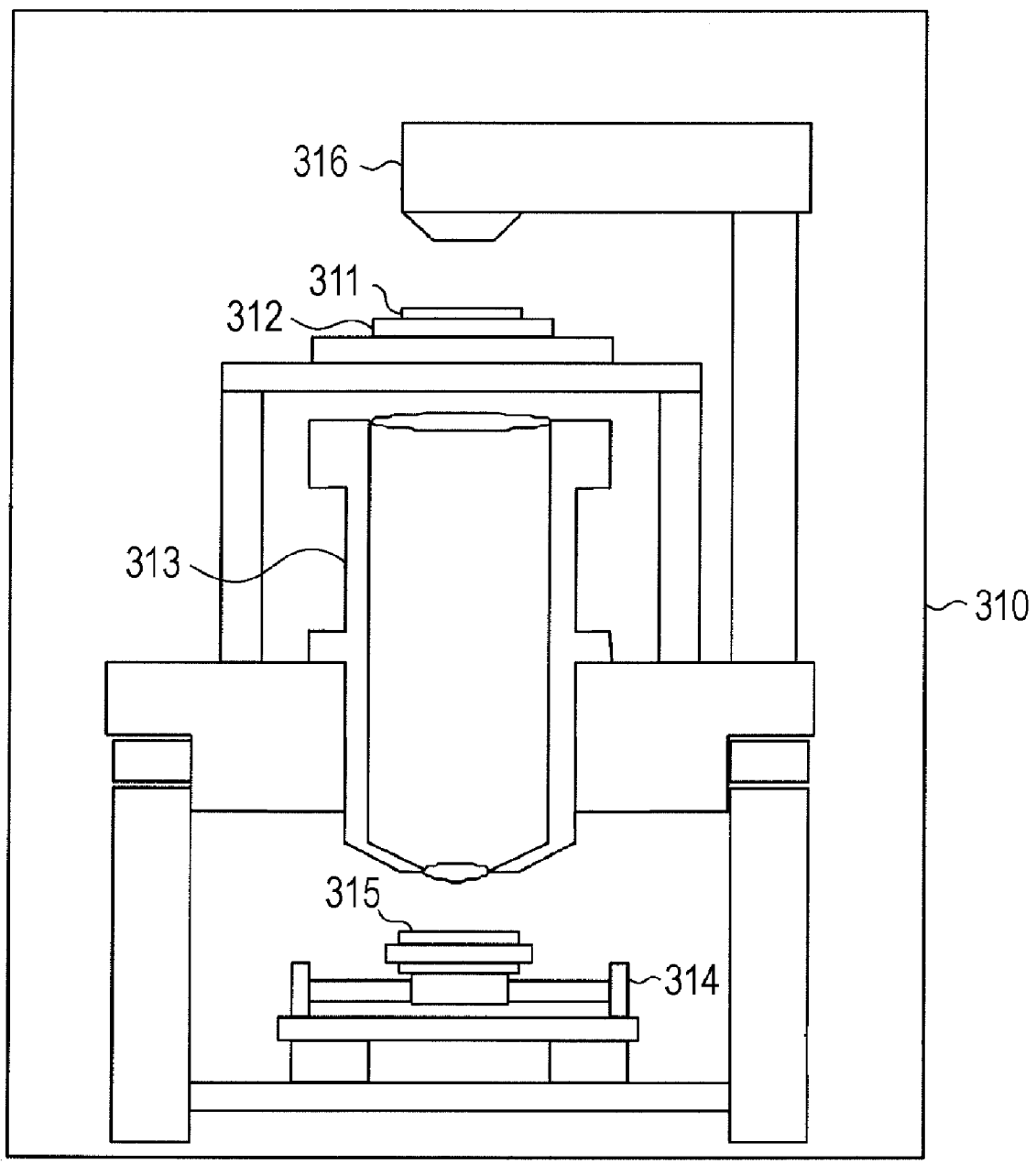
FIG. 7 is a schematic view of an example exposure apparatus.

First, an example structure of an exposure apparatus will be described with reference to FIG. 7. In an exposure space 310, exposure light emitted from a light source (not shown) irradiates a reticle 311 disposed on a reticle stage 312 by an illumination optical system 316. The light passing through the reticle 311 passes through a projection optical system 313, and reaches a wafer 315 (see FIG. 7) disposed on a wafer stage 314. With this, fine patterns formed on the reticle are transferred onto chips on the wafer 315. The light source includes KrF lasers and ArF lasers having smaller wavelengths suitable for finer exposure. In exposure apparatuses referred to as steppers, the reticle stage 312 is fixed, whereas the wafer stage 314 is fixed during exposure of a chip and moved by one step after the exposure of the chip for the exposure of the next chip.

In exposure apparatuses referred to as scanning steppers, the reticle stage 312 and the wafer stage 314 are synchronously scanned in opposite directions during exposure of a chip, and the wafer stage 314 is moved by one step after the exposure of the chip for the exposure of the next chip. In the scanning steppers, the reticle stage 312 and the wafer stage 314 are accelerated with a higher acceleration and synchronously scanned during the exposure at a higher speed to improve the productivity. It is necessary to drive the stages at extremely high speed for improved productivity, and to control the positions and the speeds with extremely high precision for finer exposure. In general, in order to control the positions of the stages with a precision on the order of nanometers, the positions of the stages are always monitored using laser interferometers (not shown), and are controlled by feedback control. However, when high-temperature heat is generated during driving of the stages, the heat affects the temperature of the light paths of the laser interferometers, and as a result, causes fluctuations in the refractive index of the air of the light paths and a large error in the measured positions of the stages. In order to control the stages on the order of nanometers, the fluctuations in the temperature of the light paths of the interferometers need to be within 0.01° C. or less.

On the other hand, typical semiconductor fabrication laboratories have clean rooms including various semiconductor manufacturing apparatuses and sub-fabs including equipment items. In the clean rooms, the temperature is adjusted to about 20 to 25° C., and the air cleanliness is maintained at a high level for fine patterning. Since the maintenance of the clean rooms greatly affects costs and energy saving, a reduction in the footprint of the manufacturing apparatuses installed in the clean rooms is required. The sub-fabs are often located below the clean rooms, and the air is not especially conditioned or cleaned in most cases. Since it is necessary to control the temperature of exposure spaces in a range of +0.01° C. as described above, the clean rooms in which exposure apparatuses are installed require air conditioners dedicated to the exposure apparatuses. Moreover, in order to recover heat generated by, for example, driving devices in the exposure apparatuses, temperature-controlled liquid is circulated inside the exposure apparatuses so as to recover heat while the temperature of the exposure spaces is maintained at a constant level.

First Exemplary Embodiment

Figure 1:
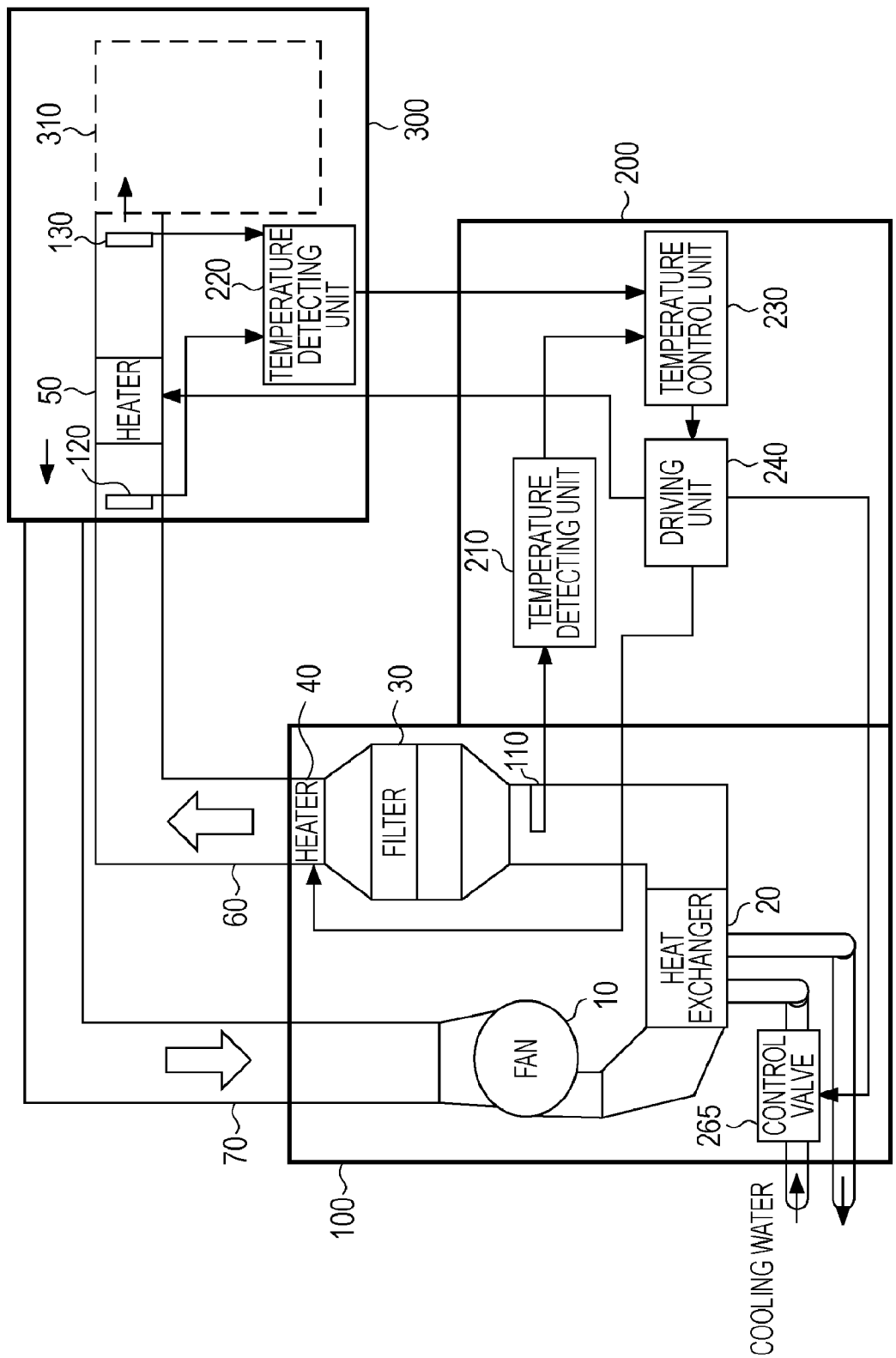
FIG. 1 illustrates an example structure of an exposure system according to a first exemplary embodiment of the present invention.

Next, an example exposure system according to a first exemplary embodiment of the present invention will be described with reference to FIG. 1.

The exposure system according to the first exemplary embodiment includes an exposure apparatus 300 that exposes a wafer 315 serving as a substrate and a fluid supplying apparatus 100 that supplies fluid to the exposure apparatus 300 via flow channels. The fluid supplying apparatus 100 includes a fan 10 serving as a fluid sending unit for circulating the fluid via the exposure apparatus 300 and a heat exchanger 20 serving as a first temperature adjusting unit that adjusts the temperature of the fluid. The fluid supplying apparatus 100 further includes a chemical filter 30, serving as a removing unit that removes unwanted substances in the fluid, disposed downstream of the heat exchanger 20 serving as the first temperature adjusting unit in the fluid supplying apparatus 100. Moreover, the fluid supplying apparatus 100 includes a first temperature sensor 110, serving as a first temperature measuring unit that measures the temperature of the fluid, disposed between the first temperature adjusting unit and the removing unit. The information on the measured temperature is used for controlling the first temperature adjusting unit. In addition, the fluid supplying apparatus 100 includes a heater 40, serving as a second temperature adjusting unit that adjusts the temperature of the fluid, disposed downstream of the removing unit in the fluid supplying apparatus 100. The exposure apparatus 300 includes a second temperature sensor 120 serving as a second temperature measuring unit that measures the temperature of the fluid supplied from the fluid supplying apparatus 100. The heater 40 serving as the second temperature adjusting unit adjusts the temperature of the fluid on the basis of the information on the temperature measured by the second temperature sensor 120 serving as the second temperature measuring unit.

The exposure system according to the first exemplary embodiment includes a temperature control unit 230 serving as a control unit that controls the operation of the first temperature adjusting unit on the basis of the information on the temperature measured by the first temperature measuring unit and that controls the operation of the second temperature adjusting unit on the basis of the information on the temperature measured by the second temperature measuring unit.

The temperature control unit 230 serving as the control unit includes a first operation section 400 (not shown; See FIG. 4) that controls the operation of the first temperature adjusting unit, a second operation section 500 (not shown; See FIG. 4) that controls the operation of the second temperature adjusting unit, and a third operation section 600 that provides output in accordance with the output from the second operation section 500 (not shown; See FIG. 4). The first operation section 400 controls the operation of the first temperature adjusting unit on the basis of the information on the temperature measured by the first temperature measuring unit and the output from the third operation section 600.

In the first exemplary embodiment, the heat exchanger 20 serving as the first temperature adjusting unit includes a cooing unit that cools the fluid, and the heater 40 serving as the second temperature adjusting unit includes a heating unit that heats the fluid.

In the first exemplary embodiment, the exposure apparatus 300 further includes a heater 50, serving as a third temperature adjusting unit that adjusts the temperature of the fluid, disposed downstream of the second temperature measuring unit in the exposure apparatus 300. In the first exemplary embodiment, the exposure apparatus 300 further includes a third temperature sensor 130, serving as a third temperature measuring unit that measures the temperature of the fluid, disposed downstream of the third temperature adjusting unit in the exposure apparatus 300. The temperature control unit 230 serving as the control unit includes a fourth operation section 700 (not shown; See FIG. 4) that controls the operation of the third temperature adjusting unit on the basis of the information on the temperature measured by the third temperature measuring unit. Moreover, in the first exemplary embodiment, the fluid is a gas. Furthermore, in the first exemplary embodiment, the exposure apparatus 300 is installed in a clean room, and the fluid supplying apparatus 100 is installed outside the clean room.

The first exemplary embodiment will now be described in more detail. The exposure apparatus 300 and the fluid supplying apparatus 100 each include a separate housing. The exposure apparatus 300 and the fluid supplying apparatus 100 are connected to each other by a feedback duct 70 serving as a flow channel unit, and part of the air in the exposure apparatus 300 is drawn by the fan (a fluid driving unit or the fluid sending unit) 10. The air receives the heat generated by the exposure apparatus 300, changes in the ambient temperature in the clean room, and the heat generated by the fan 10, and passes through the heat exchanger 20 such that the heat is recovered and reduced. The value measured by the first temperature sensor 110 disposed downstream of the heat exchanger 20 is converted into digital signals by a temperature detecting unit 210, and an operation amount used for adjusting the temperature of the air measured by the first temperature sensor 110 serving as the temperature measuring unit to a predetermined value is calculated by the temperature control unit 230. The operation amount is output to a driving unit 240. Signals output from the driving unit 240 are input to a control valve 265 such that the flow rate of cooling water supplied from a factory to the heat exchanger 20 is adjusted, and the temperature of the air passing through the heat exchanger 20 measured by the first temperature sensor 110 is controlled to be at a predetermined value. The heat can be recovered and reduced by the heat exchanger 20 by use of a refrigeration cycle using a refrigeration machine including a compressor, an expansion valve, an evaporator, and a refrigerant gas.

The chemical filter 30 serving as the removing unit that removes unwanted substances in the fluid is disposed downstream of the first temperature sensor 110 serving as the temperature measuring unit. The air in the clean room contains chemical pollutants such as basic gases including ammonia and amine; acid gases including sulfuric acid, nitric acid, and hydrogen chloride; and organic gases including siloxane generated by the semiconductor manufacturing apparatus and other electronic devices in trace amounts. When the air containing these chemical pollutants enters the exposure apparatus, the chemical pollutants can photochemically react with the exposure light source such as excimer laser beams that are short-wavelength ultraviolet rays, and can adhere to the surfaces of optical parts in the exposure apparatus, resulting in fogging of the parts. The adhesion of the fogging substances can cause a reduction or unevenness in the illuminance of the exposure light, and can preclude the exposure performance from being kept at a predetermined level. The chemical filter 30 removes the basic gases and the acid gases by using an ion-exchange reaction, and removes the organic gases by physically adhering the gases using activated carbon. For example, a plurality of quadrangular chemical filters, each of whose sides is 600 mm and whose thickness is 60 mm, can be stacked so as to reduce the concentration of the chemical pollutants. Since the chemical filter has large dimensions, a very high heat capacity, and an extremely long thermal time constant ranging from several minutes to several tens of minutes, there is a long time lag between the temperature at the entrance of the chemical filter and that at the exit of the chemical filter.

Since the chemical filter absorbs or vaporizes moisture in the air when the humidity in the air before and behind the chemical filter is changed, the temperature of the air downstream of the chemical filter is changed by the heat absorption or the heat vaporization. Furthermore, a temperature disturbance caused by a difference between the temperature of a supply duct 60 serving as a flow channel unit that connects the fluid supplying apparatus 100 and the exposure apparatus 300 and the ambient temperature of the supply duct 60 is superimposed on the air. The heater 40 serving as the temperature adjusting unit is disposed downstream of the chemical filter 30 so as to reduce the influences of the temperature disturbances caused by the thermal time constant of the chemical filter 30, changes in the humidity, and the supply duct 60. The heater 40 serving as the temperature adjusting unit can be, for example, an electric heater, a unit including a Peltier element, or a cooling unit. The air passing through the chemical filter 30 passes through the heater 40, and is supplied to the exposure apparatus 300 via the supply duct 60.

The temperature of the supplied air is measured by the second temperature sensor 120 serving as the temperature measuring unit. The value measured by the second temperature sensor 120 is converted into digital signals by a temperature detecting unit 220, and transmitted to the temperature control unit 230. The temperature control unit 230 calculates an operation amount used for adjusting the temperature of the air measured by the second temperature sensor 120 to a predetermined value, and adjusts the heater 40 via the driving unit 240. According to this structure, the chemical filter 30 and the heater 40 are included in the fluid supplying apparatus 100 separated from the exposure apparatus 300. Thus, the footprint of the exposure apparatus can be significantly reduced.

Moreover, since the temperature control unit 230 that performs operations for control and the driving unit 240 that drives the control valve 265 and the heater 40 are also included in a control panel 200 separated from the exposure apparatus 300, the footprint of the exposure apparatus 300 can be significantly reduced. The control panel 200 can be included in the fluid supplying apparatus 100, or can be included in a housing separated from that of the fluid supplying apparatus 100. The footprint of the clean room can be significantly reduced by installing the fluid supplying apparatus 100 and the control panel 200 in a sub-fab. The heater 40 and the second temperature sensor 120 disposed downstream of the chemical filter 30 constitute a feedback control system. With this, the temperature disturbance caused by the chemical filter 30 and that superimposed by the supply duct 60 can be reduced with fast control response without any influences of the thermal time constant of the chemical filter. Moreover, the air passing through the heater 40 passes through the supply duct 60 at a speed of several meters per second, and becomes turbulent in the duct. With this, the heat generated by the heater 40 and the temperature disturbance caused by the supply duct 60 are dispersed, and temporal changes and uneven distribution of the temperature can be adjusted. Furthermore, since the changes and the uneven distribution of the temperature measured by the second temperature sensor 120 disposed downstream of the supply duct 60 can be reduced, the second temperature sensor 120 is ideal as a feedback point used for the feedback control.

Since the changes and the uneven distribution are reduced by dispersing the heat and the temperature in the supply duct 60 disposed between the heater 40 and the second temperature sensor 120 in this manner, the temperature of the air supplied to the exposure apparatus 300 and measured by the second temperature sensor 120 can be controlled so as to be stable. Furthermore, since the supply duct 60 is installed outside the exposure apparatus 300, the footprint of the exposure apparatus 300 can be significantly reduced. In particular, when the fluid supplying apparatus 100 and the control panel 200 are installed in a sub-fab located below the clean room and the supply duct 60 and the feedback duct 70 are connected to a lower portion of the exposure apparatus, the footprint of the ducts in the clean room can be significantly reduced.

The wafer stage and the reticle stage described above require temperature stability in a range of ±0.01° C. or less. To this end, the heater 50 and the third temperature sensor 130 are provided for the exposure apparatus 300. The value measured by the third temperature sensor 130 is converted into digital signals by the temperature detecting unit 220, and the signals are transmitted to the temperature control unit 230. The temperature control unit 230 can be configured to calculate an operation amount used for adjusting the temperature of the air measured by the third temperature sensor 130 to a predetermined value and to adjust the heater 50 via the driving unit 240. Also in this case, the temperature control unit 230 that performs operations for control and the driving unit 240 that drives the heater 50 are included in the control panel 200 separated from the exposure apparatus 300. Thus, the footprint of the exposure apparatus 300 can be significantly reduced, and the temperature of the air supplied to the exposure space 310 can be controlled so as to be in an extremely stable state.

Next, example structures of the fluid supplying apparatus 100 and the control panel 200 will be described with reference to FIG. 2.

Figure 2:
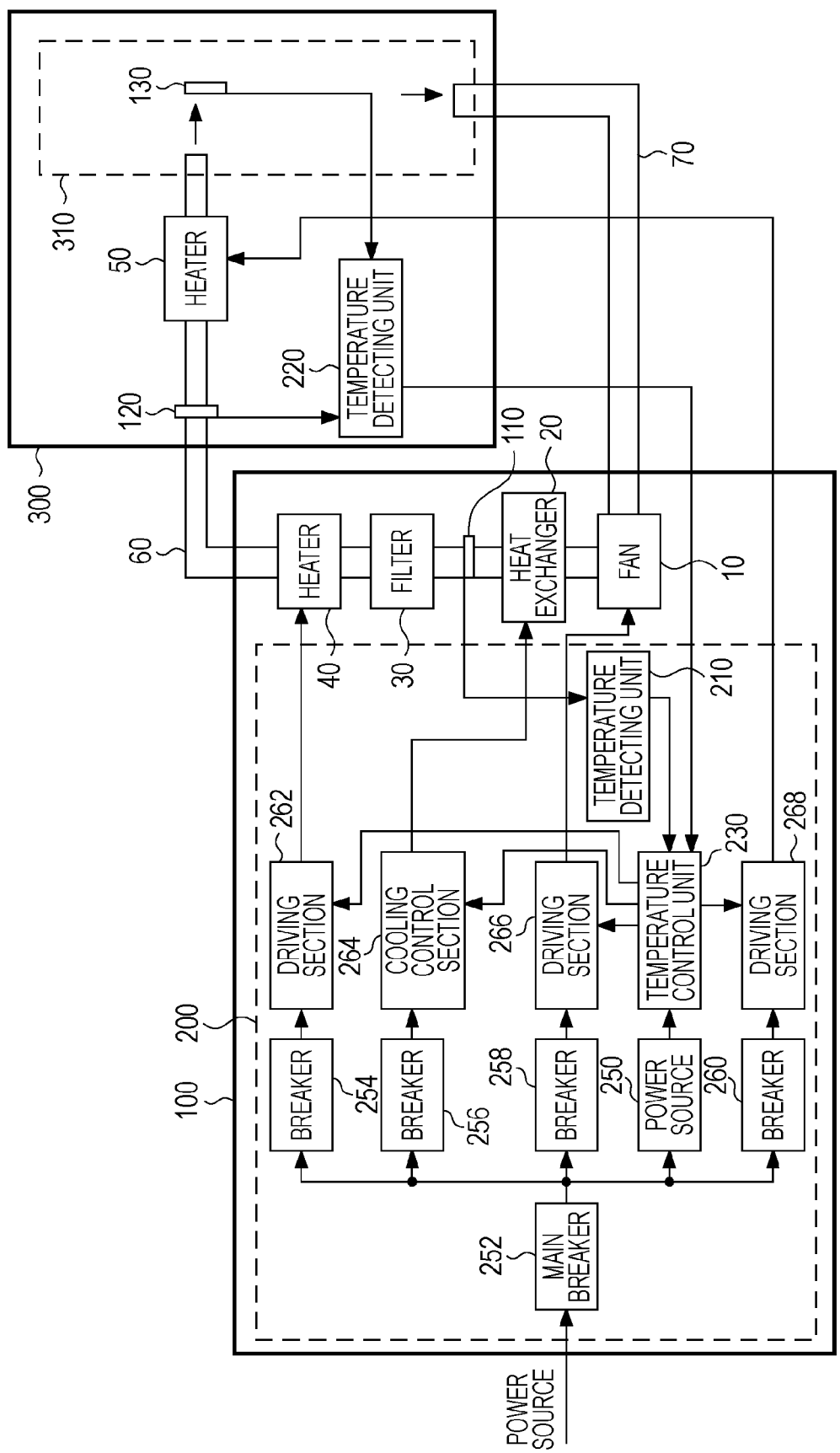
FIG. 2 illustrates an example structure of electrical devices constituting a fluid supplying apparatus in the exposure system according to the first exemplary embodiment of the present invention.

In FIG. 2, the same reference numbers are used for the same and/or similar components, and the descriptions thereof will be omitted. The control panel 200 indicated by a dashed line inside the fluid supplying apparatus 100 can be integrated into the fluid supplying apparatus, or can be included in a separate housing. Moreover, the control panel 200 is not necessarily included in one housing, and can be arranged in separate housings.

In order to drive the heaters 40 and 50, some protection devices are required for safety of the apparatuses. A power line from the factory is connected to a main breaker 252 in the control panel 200, and then branches to driving systems including a driving section 262, a cooling control section 264, a driving section 266, and a driving section 268 via breakers 254, 256, 258, and 260, respectively. The breakers cut off current so as to prevent an overcurrent when a short occurs. The driving sections 262 and 268 that drive the heaters 40 and 50, respectively, can be electric power regulators using thyristors or solid-state relays when the heaters are driven by an AC power source, and can be linear voltage output units when the heaters are driven by a DC power source. The cooling control section 264 is provided with a control device for driving the control valve 265 described with reference to FIG. 1 or a control device for driving a refrigeration machine, if used. The driving section 266 is an inverter for driving the fan 10. A power source 250 that supplies power to the temperature control unit 230 can be provided for the control panel 200 if required. Although a large number of electrical devices are arranged in the control panel 200 as described above, the devices do not affect the footprint of the exposure apparatus 300 since the devices are installed outside the exposure apparatus.

Figure 3:
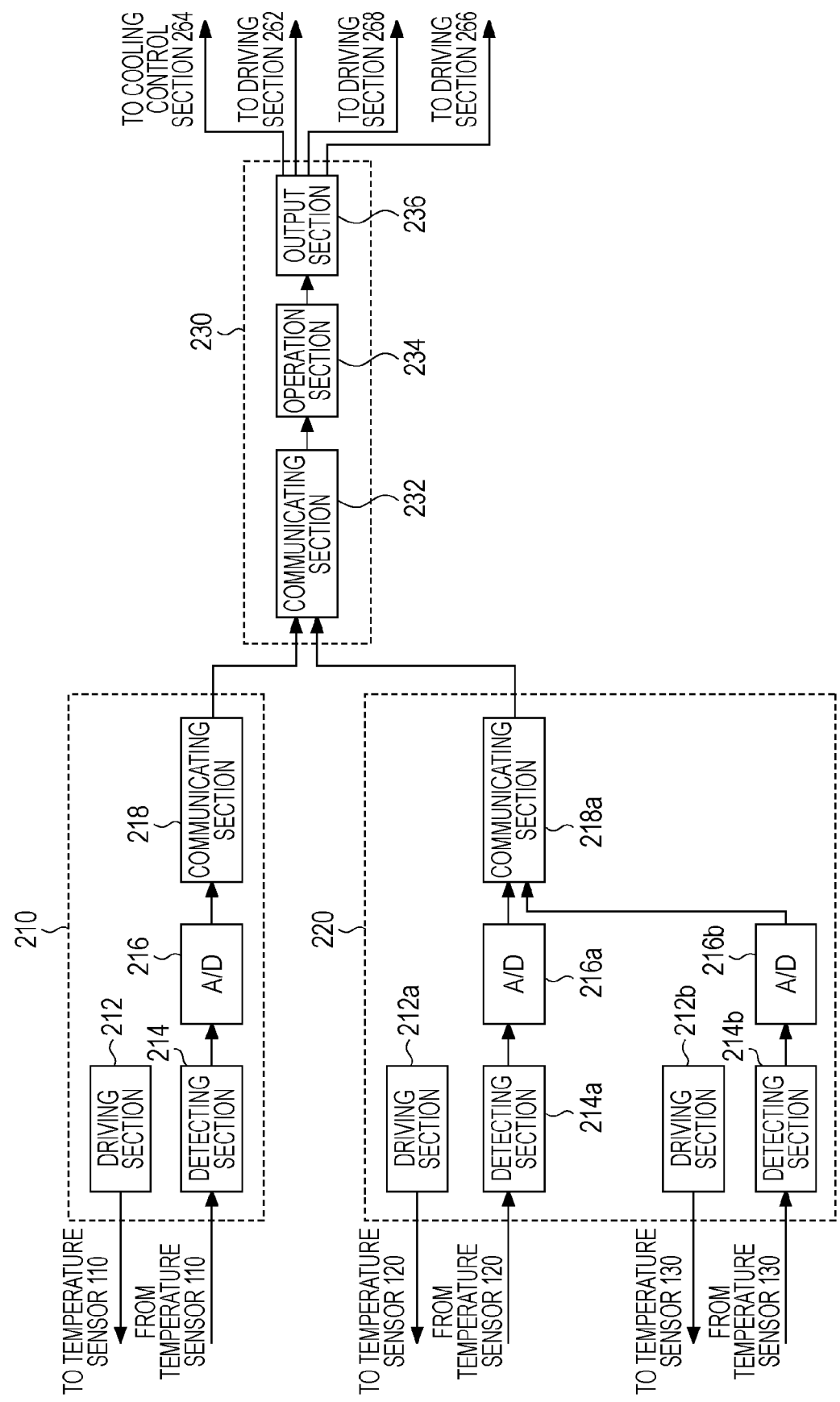
FIG. 3 illustrates example structures of temperature detecting units and a temperature control unit constituting the fluid supplying apparatus in the exposure system according to the first exemplary embodiment of the present invention.

Next, the temperature control unit 230 and the temperature detecting units 210 and 220 will be described with reference to FIG. 3. When the temperature sensors 110, 120, and 130 are, for example, platinum resistors or thermistors whose resistance is changed in accordance with temperature, the temperature sensors 110, 120, and 130 are provided with driving sections 212, 212a, and 212b, respectively, that supply specific currents to the temperature sensors. Furthermore, the temperature sensors 110, 120, and 130 are provided with detecting sections 214, 214a, and 214b, respectively, that detect voltages between both ends of each temperature sensor. The signals from the detecting sections are amplified as required, and converted into digital signals by A/D converters 216, 216a, and 216b. Subsequently, the temperature detection data is sent to a communicating section 232 in the temperature control unit 230 by communicating sections 218 and 218a. When the data is sent via serial communication, signals from the plurality of temperature sensors can be sent using a few communication lines. This leads to a significant reduction in the number of cables.

In this example, the signals output from the temperature sensors 120 and 130 in the exposure apparatus 300 and converted into digital signals by the A/D converters are sent from the communicating section 218a to the temperature control unit 230. The signals are received by the communicating section 232, and operations for temperature control are performed by an operation section 234 including, for example, a digital signal processor on the basis of the signals. Typically, operations for PID control, for example, are performed. The output from the operation section 234 is sent to the cooling control section 264 and the driving sections 262, 266, and 268 via an output section 236 including, for example, a D/A converter or a PWM output unit whose duty ratio can be changed. Cabling from the temperature control unit 230 to the driving sections and that from, for example, the breakers to the driving sections described above require a large space as does component mounting. However, these components do not affect the footprint of the exposure apparatus 300 since the components are installed outside the exposure apparatus. Although the cable used for driving the heater 50 included in the exposure apparatus 300 extends from the driving section 268 in the control panel 200, the footprint required for the exposure apparatus 300 can be kept to a minimum.

Figure 4:
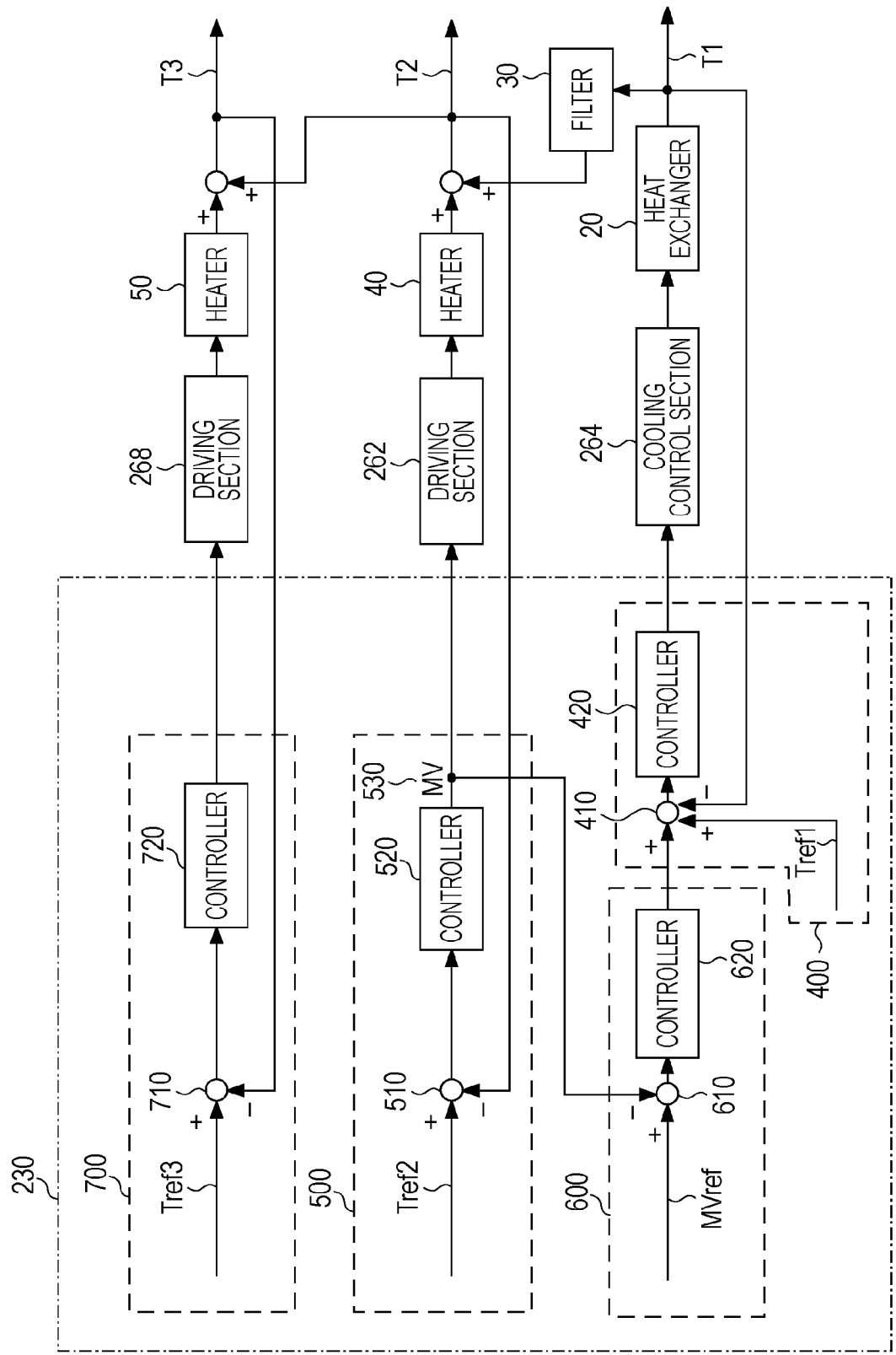
FIG. 4 is a block diagram of an example temperature control system constituting the fluid supplying apparatus in the exposure system according to the first exemplary embodiment of the present invention.

Next, operations performed by the temperature control unit 230 will be described with reference to FIG. 4. The portion enclosed by an alternate long and short dash line illustrates a block diagram of the operation part in the temperature control unit 230.

The first operation section 400 performs feedback control on the value of the first temperature sensor 110 disposed downstream of the heat exchanger 20. The value (T1) fed back from the first temperature sensor 110 to the first operation section 400 is added to or subtracted from the sum of the target value (Tref1) and a value output from a controller 620 by an adder-subtractor 410. A controller 420 performs operations for PID control, and adjusts the temperature of the air measured by the first temperature sensor 110 to a predetermined value by driving the cooling control section 264.

After the fluid passes through the chemical filter 30, the heater 40, and the supply duct 60, the second operation section 500 performs feedback control on the value of the second temperature sensor 120 included in the exposure apparatus 300. The value (T2) fed back from the second temperature sensor 120 to the second operation section 500 is added to or subtracted from the target value (Tref2) by an adder-subtractor 510. A controller 520 performs operations for PID control, and adjusts the temperature of the air measured by the second temperature sensor 120 to a predetermined value by driving the driving section 262. At this moment, the output from the controller 520, that is, an operation amount (MV) 530 is added to or subtracted from the target value (Mvref) by an adder-subtractor 610 in the third operation section 600. Furthermore, the controller 620 performs operations for P control, PI control, or PID control, and the output is input to the adder-subtractor 410 in the first operation section 400.

The third operation section 600 can be configured to control the operation amount input to the cooling control section 264 such that the MV 530 output from the second operation section 500 can be adjusted to a predetermined value. In this case, the first operation section 400 removes the heat load in the exposure apparatus 300 and the heat disturbance superimposed by the feedback duct 70 and the fluid supplying apparatus 100, and adjusts the temperature of the air measured by the first temperature sensor 110 to a predetermined value. Furthermore, the second operation section 500 adjusts the temperature of the air measured by the second temperature sensor 120 in the exposure apparatus 300 to a predetermined value against the temperature disturbance caused by the chemical filter 30, environmental changes superimposed by the supply duct 60, and a disturbance caused by, for example, changes in load in the exposure apparatus. The third operation section 600 reduces the cooling capacity of the cooling control section 264 through the output from the third operation section 600 when the MV 530 output from the second operation section is large, that is, when the heater 40 needs to heat the air with a heating capacity higher than a predetermined level.

In contrast, when the heater 40 needs to heat the air with a heating capacity lower than a predetermined level, the third operation section 600 controls such that the cooling capacity of the cooling control section 264 is increased through the output from the third operation section 600. In this manner, the third operation section 600 controls the first operation section 400 and the second operation section 500 such that the operation sections 400 and 500 are interrelated, and changes the cooling capacity of the cooling control section 264 when the temperature disturbances become so large as to exceed the heating capacity of the heater 40. With this, the temperature can always be controlled with high precision.

Furthermore, the fourth operation section 700 performs feedback control on the value of the third temperature sensor 130 included in the exposure apparatus 300. The value (T3) fed back from the third temperature sensor 130 to the fourth operation section 700 is added to or subtracted from the target value (Tref3) by an adder-subtractor 710. A controller 720 can be configured to perform operations for PID control, and to adjust the temperature of air measured by the third temperature sensor 130 to a predetermined value by driving the driving section 268. Since the temperature control unit 230 that performs operations for control is included in the control panel 200 separated from the exposure apparatus 300, the footprint of the exposure apparatus 300 can be reduced. Thus, the exposure system according to this exemplary embodiment can exhibit highly precise temperature stability while the footprint of the exposure apparatus can be reduced.

Second Exemplary Embodiment

Figure 5:
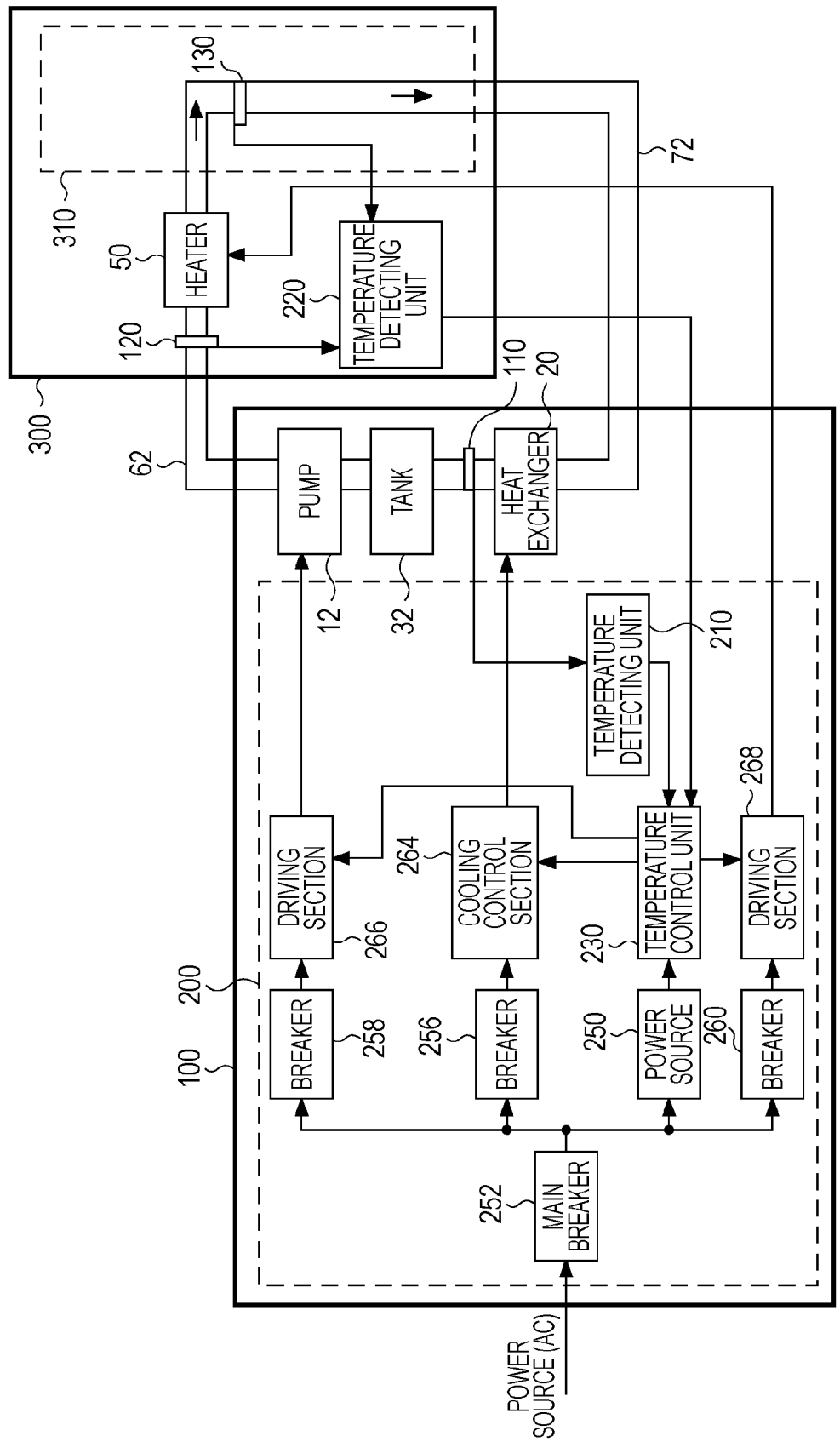
FIG. 5 illustrates an example structure of electrical devices constituting a fluid supplying apparatus in an exposure system according to second and third exemplary embodiments of the present invention.

Next, an example exposure system according to a second exemplary embodiment of the present invention will be described. FIG. 5 illustrates an example structure of the exposure system according to the second exemplary embodiment of the present invention.

Referring to FIG. 5, the exposure system according to the second exemplary embodiment includes an exposure apparatus 300 that exposes a wafer 315 serving as a substrate and a fluid supplying apparatus 100 that supplies fluid to the exposure apparatus 300 via flow channels. The fluid supplying apparatus 100 includes a pump 12 serving as a fluid sending unit for circulating the fluid via the exposure apparatus 300 and a heat exchanger 20 serving as a first temperature adjusting unit that adjusts the temperature of the fluid.

Moreover, the fluid supplying apparatus 100 includes a first temperature sensor 110, serving as a first temperature measuring unit that measures the temperature of the fluid, disposed downstream of the heat exchanger 20 serving as the first temperature adjusting unit. The information on the measured temperature is used for controlling the first temperature adjusting unit. The exposure apparatus 300 includes a second temperature sensor 120 serving as a second temperature measuring unit that measures the temperature of the fluid supplied from the fluid supplying apparatus 100. The first temperature adjusting unit adjusts the temperature of the fluid on the basis of the information on the temperature measured by the first temperature measuring unit and that measured by the second temperature measuring unit. The first temperature adjusting unit includes a cooling control section 264 serving as a cooling unit that cools the fluid. In the second exemplary embodiment, the exposure apparatus 300 is installed in a clean room, and the fluid supplying apparatus 100 is installed outside the clean room.

In the second exemplary embodiment, the fluid is a liquid. The same reference numbers are used for components having the same and/or similar functions as those in the first exemplary embodiment, and the descriptions thereof will be omitted. The exposure apparatus 300 and the fluid supplying apparatus 100 are connected to each other using a supply pipe 62 and a feedback pipe 72. The liquid supplied from the fluid supplying apparatus 100 to the exposure apparatus 300 can be, for example, pure water, a coolant containing a rust-proofing agent, or a fluorine-based inert liquid having high electrical insulation. The temperature of the liquid returned to the heat exchanger 20 is increased since the liquid recovers the heat in the exposure apparatus 300.

The cooling control section 264 is controlled such that the temperature of the liquid measured by the first temperature sensor becomes a predetermined value. After the liquid passes through the tank 32, the liquid is supplied to the exposure apparatus 300 by the pump 12 via the supply pipe 62, and the temperature thereof is measured by the second temperature sensor 120. The value measured by the second temperature sensor 120 is converted into digital signals by a temperature detecting unit 220, and transmitted to a temperature control unit 230. The temperature control unit 230 calculates an operation amount used for adjusting the temperature of the liquid measured by the second temperature sensor 120 to a predetermined value, and controls the quantity of heat to be exchanged at the heat exchanger by adjusting the cooling control section 264.

According to the structure, the temperature control unit 230 that performs operations for control, the cooling control section 264, and a breaker 256 serving as a protection device are included in a control panel 200 separated from the exposure apparatus 300. Thus, the footprint of the exposure apparatus 300 can be significantly reduced. The control panel 200 can be integrated into the fluid supplying apparatus 100, or can be included in a separate housing.

Third Exemplary Embodiment

Next, an exposure system according to a third exemplary embodiment of the present invention will be described. An exposure apparatus according to the third exemplary embodiment has the same and/or similar structure as that according to the second exemplary embodiment shown in FIG. 5 except that the exposure apparatus 300 further includes a heater 50 and a third temperature sensor 130. The exposure system according to the third exemplary embodiment includes an exposure apparatus 300 that exposes a wafer 315 serving as a substrate and a fluid supplying apparatus 100 that supplies fluid to the exposure apparatus 300 via flow channels.

The fluid supplying apparatus 100 includes a pump 12 serving as a fluid sending unit for circulating the fluid via the exposure apparatus 300 and a heat exchanger 20 serving as a first temperature adjusting unit that adjusts the temperature of the fluid. Moreover, the fluid supplying apparatus 100 includes a first temperature sensor 110, serving as a first temperature measuring unit that measures the temperature of the fluid, disposed downstream of the heat exchanger 20 serving as the first temperature adjusting unit. The information on the measured temperature is used for controlling the first temperature adjusting unit. The exposure apparatus 300 includes a second temperature sensor 120 serving as a second temperature measuring unit that measures the temperature of the fluid supplied from the fluid supplying apparatus 100.

The exposure apparatus 300 includes the heater 50, serving as a second temperature adjusting unit that adjusts the temperature of the fluid, disposed downstream of the second temperature measuring unit in the exposure apparatus 300. The exposure apparatus 300 further includes the third temperature sensor 130, serving as a third temperature measuring unit that measures the temperature of the fluid, disposed downstream of the second temperature adjusting unit in the exposure apparatus 300. The information on the measured temperature is used for controlling the second temperature adjusting unit. The first temperature adjusting unit adjusts the temperature of the fluid on the basis of the information on the temperature measured by the first temperature measuring unit and that measured by the second temperature measuring unit.

The second temperature adjusting unit adjusts the temperature of the fluid on the basis of the information on the temperature measured by the third temperature measuring unit.

A temperature control unit 230 serving as a control unit includes a first operation section 400 that controls the operation of the first temperature adjusting unit, a second operation section 500 that controls the operation of the second temperature adjusting unit, and a third operation section 600 that provides output in accordance with the output from the second operation section 500. The first operation section controls the operation of the first temperature adjusting unit on the basis of the information on the temperature measured by the first temperature measuring unit and the output from the third operation section. The first temperature adjusting unit includes a cooing unit that cools the fluid, and the second temperature adjusting unit includes a heating unit that heats the fluid. In the third exemplary embodiment, the exposure apparatus 300 is installed in a clean room, and the fluid supplying apparatus 100 is installed outside the clean room.

Since the wafer stage, the reticle stage, and the projection exposure system described above often require temperature stability in a range of +0.01° C. or less against the heat generated by actuators for driving, for example, the wafer stage, the reticle stage, and lenses in the projection optical system and the heat disturbance from the outside, the temperature of the supplied liquid needs to be controlled with high precision. The signals output from the third temperature sensor 130 are converted into digital signals by a temperature detecting unit 220, and transmitted to the temperature control unit 230. The temperature control unit 230 calculates an operation amount used for adjusting the temperature of the liquid measured by the third temperature sensor 130 to a predetermined value, and adjusts the heater 50 via a driving section 268. Also in this case, the temperature control unit 230 that performs operations for control and a driving unit 260 and the driving section 268 for driving the heater 50 are included in a control panel 200 separated from the exposure apparatus 300. Thus, the footprint of the exposure apparatus 300 can be significantly reduced, and the temperature of the liquid supplied to an exposure space 310 can be controlled so as to be in an extremely stable state.

Figure 6:
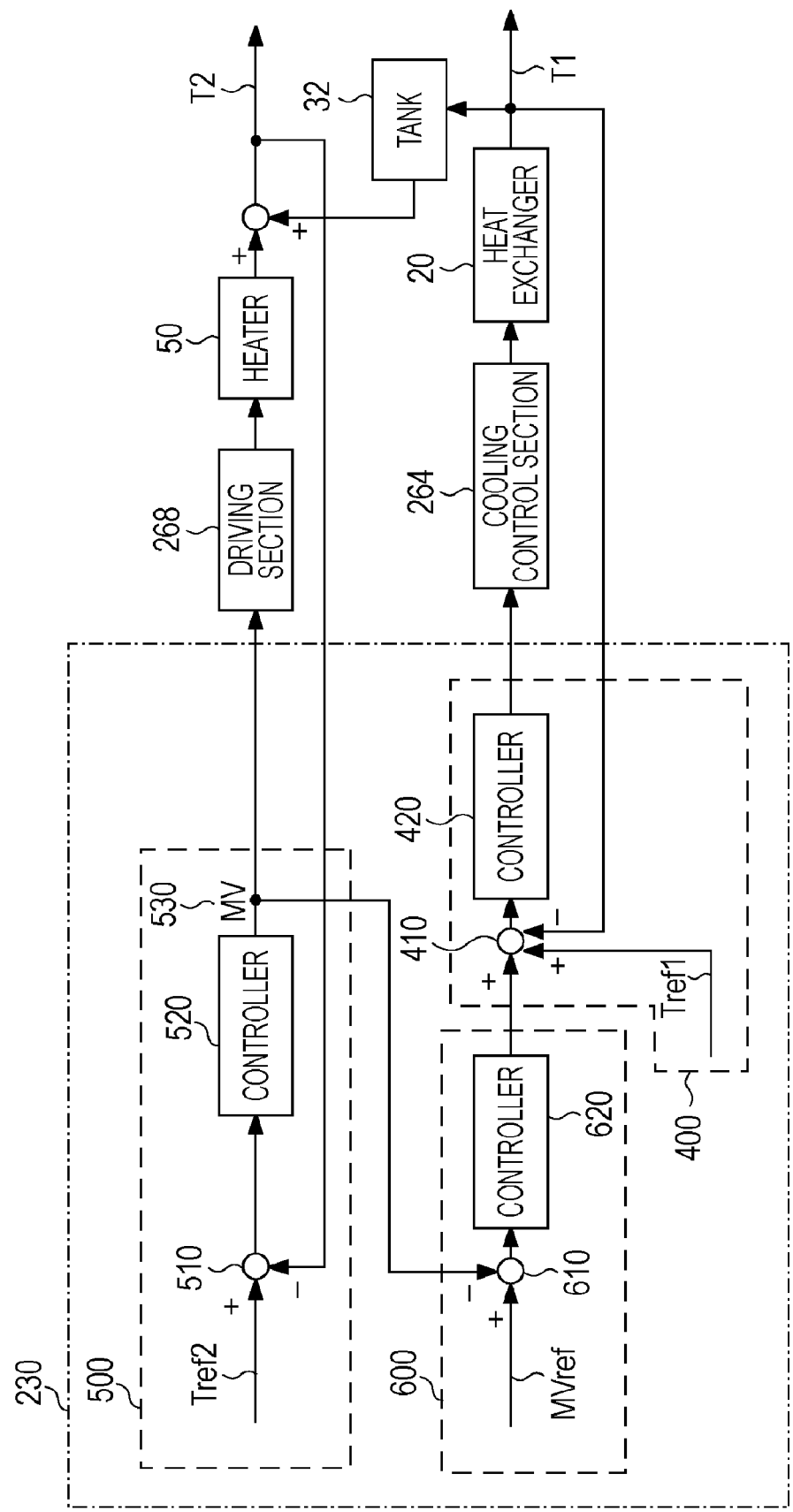
FIG. 6 is a block diagram of an example temperature control system constituting the fluid supplying apparatus in the exposure system according to the third exemplary embodiment of the present invention.

Next, example operations performed by the temperature control unit 230 will be described with reference to FIG. 6. The portion enclosed by an alternate long and short dash line illustrates a block diagram of the operation part in the temperature control unit 230. The first operation section 400 performs feedback control on the value of the first temperature sensor 110 disposed downstream of the heat exchanger 20. The value fed back from the first temperature sensor 110 to the first operation section 400 is added to or subtracted from the target value by an adder-subtractor 410. A controller 420 performs operations for PID control, and adjusts the temperature of the liquid measured by the first temperature sensor 110 to a predetermined value by driving a cooling control section 264.

After the liquid passes through a tank 32, the pump 12, and a supply pipe 62, the second operation section 500 performs feedback control on the value of the second temperature sensor 120 included in the exposure apparatus 300. The value fed back from the second temperature sensor 120 to the second operation section 500 is added to or subtracted from the target value by an adder-subtractor 510. A controller 520 performs operations for PID control, and adjusts the temperature of the liquid measured by the second temperature sensor 120 to a predetermined value by driving the driving section 268. At this moment, the output from the controller 520, that is, an operation amount (MV) 530 is added to or subtracted from the target value by an adder-subtractor 610 in the third operation section 600. A controller 620 performs operations for P control, PI control, or PID control, and the output is input to the adder-subtractor 410 in the first operation section 400. The third operation section 600 can be configured to control the operation amount input to the cooling control section 264 such that the MV 530 output from the second operation section 500 can be adjusted to a predetermined value.

In this case, the first operation section 400 removes the heat load in the exposure apparatus 300 and the heat disturbance superimposed by a feedback pipe 72 and the fluid supplying apparatus 100, and adjusts the temperature of the liquid measured by the first temperature sensor 110 to a predetermined value. The second operation section 500 adjusts the temperature of the liquid measured by the second temperature sensor 120 in the exposure apparatus 300 to a predetermined value against the heat generated by the pump 12, environmental changes superimposed by the supply pipe 62, and a disturbance caused by, for example, changes in load in the exposure apparatus. The third operation section 600 reduces the cooling capacity of the cooling control section 264 through the output from the third operation section 600 when the MV 530 output from the second operation section is large, that is, when the heater 50 needs to heat the liquid with a heating capacity higher than a predetermined level. In contrast, when the heater 50 needs to heat the liquid with a heating capacity lower than a predetermined level, the third operation section 600 controls such that the cooling capacity of the cooling control section 264 is increased through the output from the third operation section 600.

In this manner, the third operation section 600 controls the first operation section 400 and the second operation section 500 such that the operation sections 400 and 500 are interrelated, and changes the cooling capacity of the cooling control section 264 when the temperature disturbances become so large as to exceed the heating capacity of the heater 50. With this, the temperature can always be controlled with high precision. Since the temperature control unit 230 that performs operations for control is included in the control panel 200 separated from the exposure apparatus 300, the footprint of the exposure apparatus 300 can be reduced. Thus, the exposure system according to this exemplary embodiment can exhibit highly precise temperature stability while the footprint of the exposure apparatus can be reduced.

Fourth Exemplary Embodiment

Next, a method for manufacturing a device according to an exemplary embodiment of the present invention using the above-described exposure systems will be described with reference to FIGS. 8 and 9.

Figure 8:
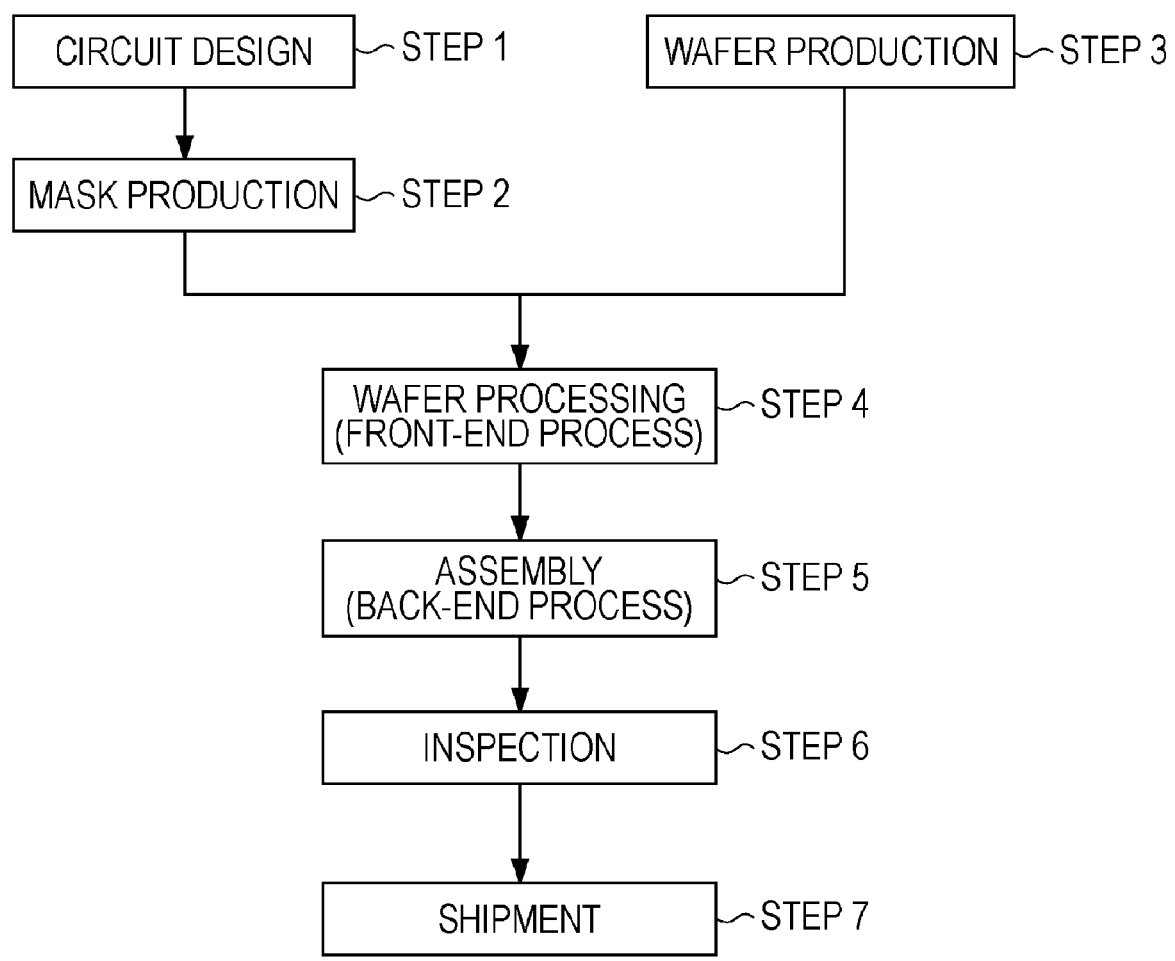
FIG. 8 is a flow chart of an example method for manufacturing devices using an exposure apparatus in an exposure system according to the first to third exemplary embodiments of the present invention.

FIG. 8 is a flow chart of manufacturing devices, for example, semiconductor chips such as ICs and LSI circuits, LCDs, or CCD sensors. Herein, a method for manufacturing semiconductor devices will be described as an example. The method includes a step of exposing wafers using the above-described exposure systems and a step of developing the exposed wafers.

More specifically, the method includes the following steps. In Step S1 (circuit design), circuits of semiconductor devices are designed. In Step S2 (mask production), masks (also referred to as originals or reticles) are produced on the basis of the designed circuit patterns. In Step S3 (wafer production), wafers (also referred to as substrates) are produced using materials such as silicon. Step S4 (wafer processing) is referred to as a front-end process in which real circuits are formed on the wafers by the above-described exposure apparatus with lithography technology using the masks and the wafers. Step S5 (assembly) is referred to as a back-end process in which semiconductor devices are produced using the wafers processed in Step S4. Step S5 includes, for example, an assembly step (dicing and bonding) and a packaging step (molding). In Step S6 (inspection), operations and durability, for example, of the semiconductor devices produced in Step S5 are checked. The semiconductor devices produced through these steps are then shipped (Step S7).

Figure 9:
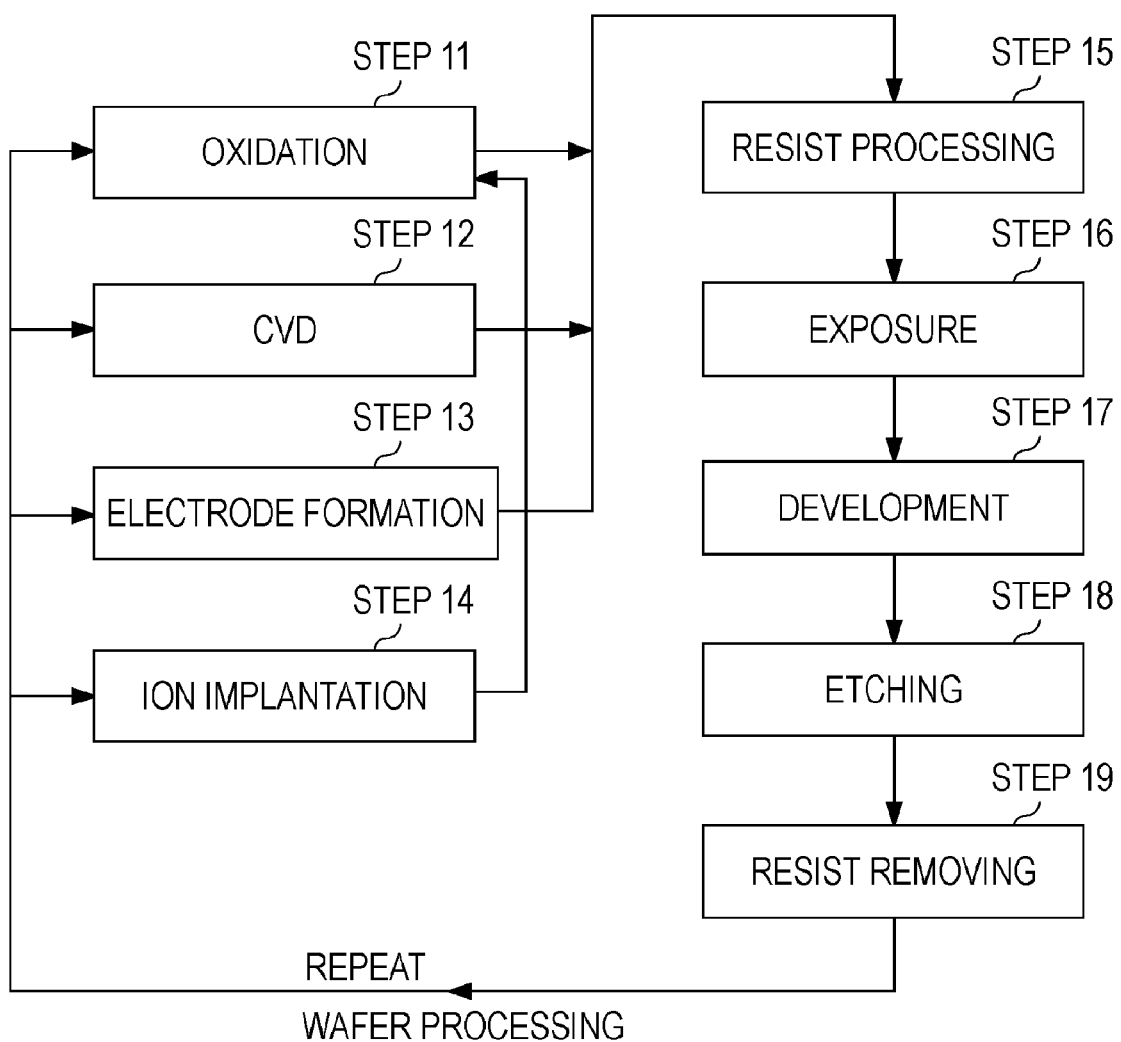
FIG. 9 is a detailed flow chart illustrating wafer processing in Step S4 in the flow chart shown in FIG. 8.

FIG. 9 is a flow chart illustrating the wafer processing in Step S4 in detail. In Step S11 (oxidation), the surfaces of the wafers are oxidized. In Step S12 (chemical vapor deposition; CVD), insulating films are deposited on the surfaces of the wafers. In Step S13 (electrode formation), electrodes are formed on the wafers. In Step S14 (ion implantation), ions are implanted in the wafers. In Step S15 (resist processing), photosensitizer is applied to the wafers. In Step S16 (exposure), the wafers are exposed to light passing through the masks having the circuit patterns using the above-described exposure systems. In Step S17 (development), the exposed wafers are developed. In Step S18 (etching), portions other than those of the developed resist images are removed. In Step S19 (resist removing), the resist that is no longer required after etching is removed. Repetition of these steps can form multiplex circuit patterns on the wafers.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-146347 filed May 31, 2007, which is hereby incorporated by reference herein in its entirety.

What is claimed is:

1. An exposure system comprising:
an exposure apparatus configured to expose a substrate; and
a fluid supplying apparatus configured to supply fluid to the exposure apparatus via a flow channel, the fluid supplying apparatus including,
a fluid sending unit configured to circulate the fluid via the exposure apparatus;
a first temperature adjusting unit configured to adjust the temperature of the fluid;
a removing unit disposed downstream of the first temperature adjusting unit in the fluid supplying apparatus and configured to remove unwanted substances in the fluid;
a first temperature measuring unit disposed between the first temperature adjusting unit and the removing unit and configured to measure the temperature of the fluid, the information on the measured temperature being used for controlling the first temperature adjusting unit; and
a second temperature adjusting unit disposed downstream of the removing unit in the fluid supplying apparatus and configured to adjust the temperature of the fluid,
wherein the exposure apparatus includes,
a second temperature measuring unit configured to measure the temperature of the fluid supplied from the fluid supplying apparatus, and
wherein the second temperature adjusting unit adjusts the temperature of the fluid on the basis of the information on the temperature measured by the second temperature measuring unit.

2. The exposure system according to claim 1, further comprising a control unit configured to control the operation of the first temperature adjusting unit on the basis of the information on the temperature measured by the first temperature measuring unit and to control the operation of the second temperature adjusting unit on the basis of the information on the temperature measured by the second temperature measuring unit.

3. The exposure system according to claim 2,
wherein the control unit includes,
a first operation section configured to control the operation of the first temperature adjusting unit;
a second operation section configured to control the operation of the second temperature adjusting unit; and
a third operation section configured to provide output in accordance with the output from the second operation section, and
wherein the first operation section controls the operation of the first temperature adjusting unit on the basis of the information on the temperature measured by the first temperature measuring unit and the output from the third operation section.

4. The exposure system according to claim 1,
wherein the first temperature adjusting unit includes a cooling unit for cooling the fluid, and
wherein the second temperature adjusting unit includes a heating unit for heating the fluid.

5. The exposure system according to claim 3,
wherein the exposure apparatus includes,
a third temperature adjusting unit disposed downstream of the second temperature measuring unit in the exposure apparatus and configured to adjust the temperature of the fluid; and
a third temperature measuring unit disposed downstream of the third temperature adjusting unit in the exposure apparatus and configured to measure the temperature of the fluid, and
wherein the control unit includes a fourth operation section configured to control the operation of the third temperature adjusting unit on the basis of the information on the temperature measured by the third temperature measuring unit.

6. The exposure system according to claim 1,
wherein the fluid is a gas, and
wherein the removing unit includes a chemical filter.

7. The exposure system according to claim 1, wherein the exposure apparatus is installed in a clean room, and the fluid supplying apparatus is installed outside the clean room.

8. An exposure system comprising:
an exposure apparatus configured to expose a substrate; and
a fluid supplying apparatus configured to supply fluid to the exposure apparatus via a flow channel;
wherein the fluid supplying apparatus includes,
a fluid sending unit configured to circulate the fluid via the exposure apparatus;
a first temperature adjusting unit configured to adjust the temperature of the fluid; and
a first temperature measuring unit disposed downstream of the first temperature adjusting unit in the fluid supplying apparatus and configured to measure the temperature of the fluid, the information on the measured temperature being used for controlling the first temperature adjusting unit;

wherein the exposure apparatus includes,
a second temperature measuring unit configured to measure the temperature of the fluid supplied from the fluid supplying apparatus, and
wherein the first temperature adjusting unit adjusts the temperature of the fluid on the basis of the information on the temperature measured by the first temperature measuring unit and the information on the temperature measured by the second temperature measuring unit.

9. The exposure system according to claim 8, wherein the first temperature adjusting unit includes a cooing unit for cooling the fluid.

10. The exposure system according to claim 9, wherein the fluid is a liquid.

11. The exposure system according to claim 8, wherein the exposure apparatus is installed in a clean room, and the fluid supplying apparatus is installed outside the clean room.

12. An exposure system comprising:
an exposure apparatus configured to expose a substrate; and
a fluid supplying apparatus configured to supply fluid to the exposure apparatus via a flow channel;
wherein the fluid supplying apparatus includes,
a fluid sending unit configured to circulate the fluid via the exposure apparatus;
a first temperature adjusting unit configured to adjust the temperature of the fluid; and
a first temperature measuring unit disposed downstream of the first temperature adjusting unit in the fluid supplying apparatus and configured to measure the temperature of the fluid, the information on the measured temperature being used for controlling the first temperature adjusting unit;
wherein the exposure apparatus includes,
a second temperature measuring unit configured to measure the temperature of the fluid supplied from the fluid supplying apparatus;
a second temperature adjusting unit disposed downstream of the second temperature measuring unit in the exposure apparatus and configured to adjust the temperature of the fluid; and
a third temperature measuring unit disposed downstream of the second temperature adjusting unit in the exposure apparatus and configured to measure the temperature of the fluid, the information on the measured temperature being used for controlling the second temperature adjusting unit,
wherein the first temperature adjusting unit adjusts the temperature of the fluid on the basis of the information on the temperature measured by the first temperature measuring unit and the information on the temperature measured by the second temperature measuring unit, and
wherein the second temperature adjusting unit adjusts the temperature of the fluid on the basis of the information on the temperature measured by the third temperature measuring unit.

13. The exposure system according to claim 12, further comprising a control unit that includes,
a first operation section configured to control the operation of the first temperature adjusting unit;
a second operation section configured to control the operation of the second temperature adjusting unit; and
a third operation section configured to provide output in accordance with the output from the second operation section, and
wherein the first operation section controls the operation of the first temperature adjusting unit on the basis of the information on the temperature measured by the first temperature measuring unit and the output from the third operation section.

14. The exposure system according to claim 12,
wherein the first temperature adjusting unit includes a cooing unit for cooling the fluid, and
wherein the second temperature adjusting unit includes a heating unit for heating the fluid.

15. The exposure system according to claim 12, wherein the fluid is a liquid.

16. The exposure system according to claim 12, wherein the exposure apparatus is installed in a clean room, and the fluid supplying apparatus is installed outside the clean room.

17. A method for manufacturing a device utilizing an exposure system which includes,
an exposure apparatus configured to expose a substrate; and
a fluid supplying apparatus configured to supply fluid to the exposure apparatus via a flow channel, the fluid supplying apparatus including,
a fluid sending unit configured to circulate the fluid via the exposure apparatus;
a first temperature adjusting unit configured to adjust the temperature of the fluid;
a removing unit disposed downstream of the first temperature adjusting unit in the fluid supplying apparatus and configured to remove unwanted substances in the fluid;
a first temperature measuring unit disposed between the first temperature adjusting unit and the removing unit and configured to measure the temperature of the fluid, the information on the measured temperature being used for controlling the first temperature adjusting unit; and
a second temperature adjusting unit disposed downstream of the removing unit in the fluid supplying apparatus and configured to adjust the temperature of the fluid,
wherein the exposure apparatus includes,
a second temperature measuring unit configured to measure the temperature of the fluid supplied from the fluid supplying apparatus, and
wherein the second temperature adjusting unit adjusts the temperature of the fluid on the basis of the information on the temperature measured by the second temperature measuring unit;
the method comprising:
exposing a substrate using the exposure apparatus; and
developing the exposed substrate.

18. An exposure system comprising:
an exposure apparatus configured to expose a substrate; and
a fluid supplying apparatus configured to supply fluid to the exposure apparatus via a flow channel, the fluid supplying apparatus including,
a fluid sending unit configured to circulate the fluid via the exposure apparatus;
a first temperature adjusting unit configured to adjust the temperature of the fluid;
a removing unit disposed downstream of the first temperature adjusting unit in the fluid supplying apparatus and configured to remove unwanted substances in the fluid;
a first temperature measuring unit disposed between the first temperature adjusting unit and the removing unit and configured to measure the temperature of the fluid, the information on the measured temperature being used for controlling the first temperature adjusting unit; and a second temperature adjusting unit disposed downstream of the removing unit in the fluid supplying apparatus and configured to adjust the temperature of the fluid, wherein the exposure apparatus includes, a second temperature measuring unit disposed downstream of the second temperature adjusting unit and configured to measure the temperature of the fluid supplied from the fluid supplying apparatus the exposure system further comprising:

a first operation section configured to control the operation of the first temperature adjusting unit on the basis of the information on the temperature measured by the first temperature measuring unit;

a second operation section configured to control the operation of the second temperature adjusting unit on the basis of the information on the temperature measured by the second temperature measuring unit; and a third operation section configured to control the operation of the third temperature adjusting unit on the basis of the information on the temperature measured by the third temperature measuring unit, wherein the first operation section controls the operation of the first temperature adjusting unit on the basis of the information on the temperature measured by the first temperature measuring unit and the output from the third operation section (claims 1-3).

19. The exposure system according to claim 18, wherein the output from the second operation section is an amount of the operation of the second operation section.

20. The exposure system according to claim 18, wherein the first temperature adjusting unit includes a cooing unit for cooling the fluid, and wherein the second temperature adjusting unit includes a heating unit for heating the fluid.

21. The exposure system according to claim 18, wherein the exposure apparatus includes, a third temperature adjusting unit disposed downstream of the second temperature measuring unit in the exposure apparatus and configured to adjust the temperature of the fluid; and a third temperature measuring unit disposed downstream of the third temperature adjusting unit in the exposure apparatus and configured to measure the temperature of the fluid, and wherein the control unit includes a fourth operation section configured to control the operation of the third temperature adjusting unit on the basis of the information on the temperature measured by the third temperature measuring unit.

22. The exposure system according to claim 18, wherein the fluid is a gas, and wherein the removing unit includes a chemical filter.

23. The exposure system according to claim 18, wherein the exposure apparatus is installed in a clean room, and the fluid supplying apparatus is installed outside the clean room.

24. An exposure system comprising:

an exposure apparatus configured to expose a substrate; and a fluid supplying apparatus configured to supply fluid to the exposure apparatus via a flow channel;

wherein the fluid supplying apparatus includes, a fluid sending unit configured to circulate the fluid via the exposure apparatus;

a first temperature adjusting unit configured to adjust the temperature of the fluid; and a first temperature measuring unit disposed downstream of the first temperature adjusting unit in the fluid supplying apparatus and configured to measure the temperature of the fluid, the information on the measured temperature being used for controlling the first temperature adjusting unit;

wherein the exposure apparatus includes, a second temperature measuring unit disposed downstream of the first temperature adjusting unit and configured to measure the temperature of the fluid supplied from the fluid supplying apparatus;

a second temperature adjusting unit disposed downstream of the second temperature measuring unit in the exposure apparatus and configured to adjust the temperature of the fluid; and a third temperature measuring unit disposed downstream of the second temperature adjusting unit in the exposure apparatus and configured to measure the temperature of the fluid, the information on the measured temperature being used for controlling the second temperature adjusting unit, the exposure system further comprising:

a first operation section configured to control the operation of the first temperature adjusting unit on the basis of the information on the temperature measured by the first temperature measuring unit and the information on the temperature measured by the second temperature measuring unit;

a second operation section configured to control the operation of the second temperature adjusting unit on the basis of the information on the temperature measured by the third temperature measuring unit; and a third operation section configured to output in accordance with the output from the second operation section, wherein the first operation section controls the operation of the first temperature adjusting unit on the basis of the information on the temperature measured by the first temperature measuring unit and the output from the third operation section.

25. The exposure system according to claim 24, wherein the output from the third operation section is an amount of the operation of the third operation section.

26. The exposure system according to claim 24, wherein the first temperature adjusting unit includes a cooing unit for cooling the fluid, and wherein the second temperature adjusting unit includes a heating unit for heating the fluid.

27. The exposure system according to claim 24, wherein the fluid is a liquid.

28. The exposure system according to claim 24, wherein the exposure apparatus is installed in a clean room, and the fluid supplying apparatus is installed outside the clean room.

29. A method for manufacturing a device utilizing an exposure system which includes, an exposure apparatus configured to expose a substrate; and a fluid supplying apparatus configured to supply fluid to the exposure apparatus via a flow channel, the fluid supplying apparatus including, a fluid sending unit configured to circulate the fluid via the exposure apparatus;

a first temperature adjusting unit configured to adjust the temperature of the fluid;

a removing unit disposed downstream of the first temperature adjusting unit in the fluid supplying apparatus and configured to remove unwanted substances in the fluid;

a first temperature measuring unit disposed between the first temperature adjusting unit and the removing unit and configured to measure the temperature of the fluid, the information on the measured temperature being used for controlling the first temperature adjusting unit; and a second temperature adjusting unit disposed downstream of the removing unit in the fluid supplying apparatus and configured to adjust the temperature of the fluid, wherein the exposure apparatus includes, a second temperature measuring unit disposed downstream of the second temperature adjusting unit configured to measure the temperature of the fluid supplied from the fluid supplying apparatus, the exposure system further including:

a first operation section configured to control the operation of the first temperature adjusting unit on the basis of the information on the temperature measured by the first temperature measuring unit;

a second operation section configured to control the operation of the second temperature adjusting unit on the basis of the information on the temperature measured by the second temperature measuring unit; and a third operation section configured to control the operation of the third temperature adjusting unit on the basis of the information on the temperature measured by the third temperature measuring unit, wherein the first operation section controls the operation of the first temperature adjusting unit on the basis of the information on the temperature measured by the first temperature measuring unit and the output from the third operation section, the method comprising:

exposing a substrate using the exposure apparatus; and developing the exposed substrate.

* * * * *